United States Patent
Koo et al.

(10) Patent No.: US 9,370,133 B2
(45) Date of Patent: Jun. 14, 2016

(54) PARTICLES WITH SPECIAL STRUCTURE FOR PREVENTING ELECTROSTATIC DISCHARGE AND PASTE CONTAINING THE SAME

(71) Applicant: SAMSUNG ELECTRO-MECHANICS CO., LTD., Suwon-si, Gyeonggi-do (KR)

(72) Inventors: Bon-Seok Koo, Suwon-si (KR); Jung-Wook Seo, Suwon-si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 125 days.

(21) Appl. No.: 14/228,920

(22) Filed: Mar. 28, 2014

(65) Prior Publication Data
US 2015/0173162 A1   Jun. 18, 2015

(30) Foreign Application Priority Data
Dec. 12, 2013 (KR) .......................... 10-2013-0154774

(51) Int. Cl.
*H05K 9/00* (2006.01)
(52) U.S. Cl.
CPC ................................. *H05K 9/0067* (2013.01)
(58) Field of Classification Search
CPC .......................................... H05F 3/00
USPC .................................. 428/402, 403
See application file for complete search history.

(56) References Cited

U.S. PATENT DOCUMENTS 6,395,149 B1 * 5/2002 Palmgren ................. 204/192.29

\* cited by examiner

*Primary Examiner* — Leszek Kiliman
(74) *Attorney, Agent, or Firm* — McDermott Will & Emery LLP

(57) ABSTRACT

The present invention relates to particles with special structure for preventing electrostatic discharge and paste containing the same. The particles having the structure of the present invention can be manufactured easily and economically. Furthermore, electrostatic discharge can be very effectively blocked through the maximized quantum tunneling effect between particles and the particles or paste of the present invention can be easily applied to high density fine circuits.

6 Claims, 1 Drawing Sheet

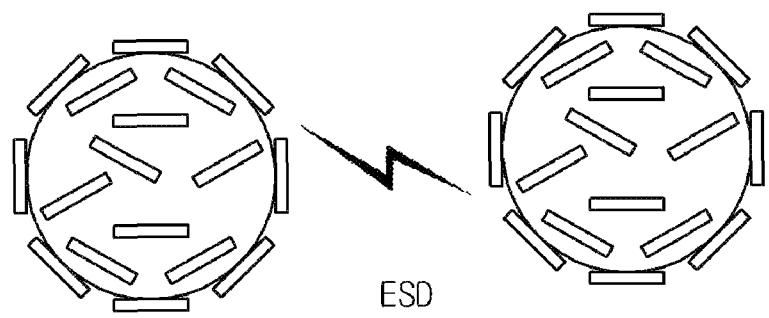

PARTICLES WITH SPECIAL STRUCTURE FOR PREVENTING ELECTROSTATIC DISCHARGE AND PASTE CONTAINING THE SAME

CROSS REFERENCE TO RELATED APPLICATION

This application claims the benefit of Korean Patent Application No. 10-2013-0154774, filed on Dec. 12, 2013, entitled "Particles with special structure for preventing electrostatic discharge and paste containing the same", which is hereby incorporated by reference in its entirety into this application.

BACKGROUND OF THE INVENTION

1. Technology Field

The present invention relates to particles with special structure for preventing electrostatic discharge and paste containing the same.

2. Description of the Related Art

As sizes of electronic devices become smaller, densities of parts mounted therein increase and mounting integrated circuits has been increasing to improve performance and decrease volumes. As a result, there is a large demand for prevention of electrostatic discharge which is generated from electronic devices.

In response to increases in use of mobile products such as smart phones and tablet PCs, use of auxiliary equipment such as USBs, direct cables and the like is also increasing rapidly for data communications between portable devices or between a portable device and a non-portable device such as a personal computer. Surge generation from power stages and signal-connecting parts included therein also increases.

Previously, components such as varistors were used to resolve this problem. However, such varistors have disadvantages such as high capacitance. When components for preventing electrostatic discharge which have high capacitance such as varistors are used, normal data transmissions can be difficult due to generation of noises and signal distortions in recent environments having increases in data transmission amount and rate. Accordingly, there is a demand for developing new products having not only low capacitance but also excellent electrostatic discharge prevention properties for high speed data transmissions.

Electrostatic discharge (ESD) is one of inevitable phenomena caused by use of electronic systems and integrated circuits. When electrostatic discharge is caused, a peak current of several amperes is generated within several hundreds of nanoseconds and it should be conducted to a protection circuit such as GND within nanoseconds. If not, high currents move to integrated circuits to cause deteriorations and damages. Since integrated circuits are very fine with having pitches of from several tens to several hundreds of meters, when surge is generated, it can cause serious damages and unrecoverable deterioration. Therefore, developments of components for preventing electrostatic discharge are highly demanded.

There are four types of protection elements to protect circuits in components.

The first type is a laminated chip varistor which comprises a metal oxide having semiconductor properties such as ZnO and sintered body electrodes. The varistor has a function to conduct significantly increased current when an applied voltage reaches a certain definite value or more. However, it requires a complicated manufacturing process including sheet molding, electrode printing, lamination, sintering and the like and is unsuitable for high speed data transmissions due to high capacitance.

The second type is a discharge-type element having electrostatic discharging properties which can be controlled by the distance of a discharging gap, the pressure and the kind of a sealed gas and the like. It has excellent electrostatic discharge properties. However, its constitution is complicated and its size is limited as a small sized surface mounting element. Even though its operation is simple, its durability is poor.

The third type is a method of forming a discharge gap and regulating a discharge voltage by the distance of the discharge gap. Here, the moisture and gases in the environment cause contamination on conductor surface and thereby the discharge voltage can be changed or the carbonization of a substrate can cause short circuit on the electrodes during being discharged.

The fourth type is a method of coating a discharge gap with paste for preventing electrostatic discharge which is a mixture of metal or metal oxide filler and resin in order to resolve the problems mentioned above and improve insulation properties at a low voltage. The metal oxide filler, which is used in manufacturing such pastes for preventing electrostatic discharge, should have properties which ZnO has. However, when the metal is used as a filler, it requires to form an oxide film on the metal surface to keep insulation properties until reaching a certain voltage.

In properties of the paste for preventing electrostatic discharge, voltage in which resistance starts to rapidly decrease in an insulation condition is called as turn-on-voltage which is an important term to explain properties of preventing electrostatic discharge. It is preferred to have a low turn-on-voltage to show excellent electrostatic discharge prevention properties so that it is more advantageous to use a filler with a larger diameter. When a spherical-shaped filler is used, the thickness of a layer of preventing electrostatic discharge is increased with increases in the diameter of the filler which can be disadvantageous in decreasing and downsizing the size of elements. There is another drawback of increasing the effects of filler to shorten the distance between fillers to lower the turn-on-voltage.

RELATED ART

KR Publication No. 2010-0034238

SUMMARY OF THE INVENTION

An object of the present invention is to provide particles for preventing electrostatic discharge having excellent electrostatic discharge prevention properties.

Another object of the present invention is to provide paste comprising the particles for preventing electrostatic discharge.

According to an aspect of the present invention, there is provided particles for preventing electrostatic discharge in which one or more rod-shaped particle is adhered to the surface of a spherical particle.

According to an embodiment of the present invention, a material of the rod-shaped particle and the spherical particle may be chosen from a metal, an oxide and a metal coated with an oxide film.

According to an embodiment of the present invention, the metal may be chosen from manganese, zirconium, tantalum, molybdenum, nickel, aluminum, chromium and a combination thereof.

According to an embodiment of the present invention, the oxide may be chosen from alumina, NiO, ZnO, $SiO_2$ and $TiO_2$.

In an embodiment of the present invention, a ratio of length of the rod-shaped particle: diameter of the spherical particle may be 5:1 to 1:20.

According to another aspect of the present invention, there is provided paste for preventing electrostatic discharge comprising the particles for preventing electrostatic discharge.

Effect of the Present Invention

The particles having the structure of the present invention can be manufactured easily and economically. Furthermore, electrostatic discharge can be very effectively blocked through the maximized quantum tunneling effect between particles and the particles or paste of the present invention can be easily applied to high density fine circuits.

BRIEF DESCRIPTION OF THE DRAWINGS

FIG. 1 is a diagram illustrating particles for preventing electrostatic discharge according to an embodiment of the present invention.

DESCRIPTIONS OF THE PRESENT INVENTION

The present invention will be described in more detail below.

The following conditions are needed to show excellent electrostatic discharge prevention properties which are required in the present invention:

1) showing electrostatic discharge prevention at a low turn-on-voltage through the quantum tunneling effect;

2) having a low leakage current during discharging of electrostatic discharge; and 3) recovering original insulation performance after discharging of electrostatic discharge.

The present invention provides particles having special shape to have the above-mentioned properties and paste comprising these particles for preventing electrostatic discharge.

According to an aspect of the present invention, particles for preventing electrostatic discharge in which one or more rod-shaped particle is adhered to the surface of a spherical particle may be provided.

A method for attaching the rod-shaped particle to the surface of the spherical particle may be dip-coating, spray-coating, mechano-fusion, precipitation or the like. When any method other than the mechano-fusion method is used, post-heat treatment may be needed to strengthen the bond between the rod-shaped particle and the spherical particle.

The particles of the present invention have a special structure which can maximize the quantum tunneling effect between particles included in the paste for preventing electrostatic discharge. It is important for the end part of the rod-shaped particles adhered on the surface of each spherical particle to be distributed evenly inside the paste to transfer the electrostatic discharge, introduced into the paste, between the particles efficiently in the quantum tunneling effect. FIG. 1 illustrates transferring the electrostatic discharge between the particles.

In addition, the edge of the rod-shaped particle can be various shapes to optimize the quantum tunneling effect. The rod-shaped particles prepared from the seed of the initial spherical particle will be a round shape and can be further processed to be a pointed shape or to have edges, if necessary.

According to an embodiment of the present invention, a material of the rod-shaped particle and the spherical particle can be chosen from a metal, an oxide and a metal coated with an oxide film.

Too highly conductive metal is undesirable for the electrostatic discharge treatment. A material which can slowly disperse the electrostatic discharge is desirable as the material for preventing electrostatic discharge and an electrostatic discharge dispersing material may have a resistance of $10^6$ to $10^{12}$ ohm-meter.

According to an embodiment of the present invention, the metal may be chosen from manganese, zirconium, tantalum, molybdenum, nickel, aluminum, chromium and a combination thereof. According to an embodiment of the present invention, the oxide may be chosen from alumina, NiO, ZnO, $SiO_2$ and $TiO_2$.

The materials for the spherical particles and the rod-shaped particles, and their surface treatments can affect the effects of electrostatic discharge treatments. When a metal is used for the spherical particles and the rod-shaped particles, short between the particles may occur due to contacts between the particles with increases in packing density.

The surfaces of the rod-shaped particles, which exist at the outmost where the particles contact each other, may be coated with an oxide film. The kind of oxide film may be chosen from ZnO, $SiO_2$ and $TiO_2$ to treat the electrostatic discharge efficiently and show properties required in the paste manufacturing process but it is not limited thereto. It is appreciated that the thickness of the oxide film be enough to maintain dielectric property and not to cause short when particles contact.

In an embodiment of the present invention, a ratio of length of the rod-shaped particle: diameter of the spherical particle may be 5:1 to 1:20. The ratio may vary with concentration, viscosity and electrical properties of the particles. Even though FIG. 1 only illustrates an example that the length of the rod-shaped particle is shorter than the diameter of the spherical particle, the length of the rod-shaped particle may be longer than the diameter of the spherical particle. Attaching the rod-shaped particles on the surface of the spherical particle can maximize the distribution of both end parts of each rod-shaped particle. When only rod-shaped particles are distributed in the paste, it may cause aggregation or it may be arranged in a particular direction. However, when rod-shaped particles adhered on the surface of the spherical particle are distributed in the paste, the rod-shaped particles may be distributed in various directions. As described above, excellent electrostatic discharge treatment effect can be obtained through the end parts of the rod-shaped particles which are evenly distributed in the present invention.

The length of the rod-shaped particle can be controlled to maximize the quantum tunneling effect. When the particles with special structure of the present invention are added to the paste with a low distribution, it is appreciated that the length of the rod-shaped particle can be longer with increases in the distance between the particles. However, when resistance between the particles becomes higher enough not to flow the electrostatic discharge, it is appreciated that the distance between the particles can be controlled with considering a voltage range (turn-on-voltage) since any effect for preventing electrostatic discharge cannot be expected. It is also appreciated that the length of the rod-shaped particle adhered on the surface of the spherical particle and the diameter of the spherical particle be proportional to each other.

According to another aspect of the present invention, paste for preventing electrostatic discharge comprising the particles for preventing electrostatic discharge may be provided.

The particles with special structure for preventing electrostatic discharge according to the present invention may be made in a form of paste by mixing a polymer resin and a solvent. Distribution of the particles and resin may be conducted by a ball mill, an apex-mill or a 3 roll-mill method, etc. particularly the 3 roll-mill method is generally used for high viscous distribution. After mixing a binder and particles, the viscosity of the result is controlled by adding additional solvent to be suitable for printing or distribution, the additionally added solvent is distributed by revolution/rotation type mixing and air bubbles in the paste are removed to provide desired paste.

The prepared paste is coated on electrodes, which function for preventing electrostatic discharge, by a screen printing or dispersing method and hardened at 150 to 200° C. for a certain time to form a layer for preventing electrostatic discharge.

Example 1

Following examples show evaluation of pastes for preventing electrostatic discharge comprising the particles with special structure according to the present invention. $TiO_2$ rod-shaped particles adhered on the surface of nickel spherical particles having a diameter of 4 μm were used as particles for preventing electrostatic discharge. Length and diameter of the rod-shaped particle were 500 nm and 50 nm, respectively.

Table 1 shows electrostatic discharge prevention properties determined with spherical particles (Comparison Example 1) and particles with special structure prepared in Example 1 of the present invention.

TABLE 1

|  | Comparison Example 1 | Example 1 |
| --- | --- | --- |
| Metal (used amount) | 74 wt % | 77 wt % |
| turn-on-voltage | 420 V | 230 V |
| viscosity | 80 kcps | 130 kcps |
| Leakage current | 0 | 0 |

Referring to Table 1, it is noted that the turn-on-voltage is significantly decreased from 420V to 230V when the rod-shaped particles adhered on the surface of the nickel spherical particles are used, compared to the nickel spherical particles are used. It is obviously noted that when the particles having special structure of the present invention are used, it shows electrostatic discharge prevention effect at a lower voltage, compared to the spherical particles.

Table 2 shows leakage current comparison between the particles for preventing electrostatic discharge of Example 1 and a mixture of rod-shaped particles and spherical particles (Comparison Example 2). The ratio of rod-shaped particles and spherical particles in the mixture of rod-shaped particles and spherical particles is the same as the ratio of rod-shaped particles and spherical particles before the rod-shaped particles are adhered to the surface of the spherical particles.

TABLE 2

|  | Comparison Example 2 | Example 1 |
| --- | --- | --- |
| Leakage current | 94% | 100% |

Total number for test of Table 2 was 100 and when the leakage current was 1 μA or less at 5V, it was determined as 'fair'. All leakage currents of the particles for preventing ESD of Example 1 were 1 μA or less, while 6 out of 100 showed the leakage current of higher than 1 μA for the simple mixture of rod-shaped particles and spherical particles. It can be noted that the particles having special structure according to the present invention are more effective to keep the initial insulation state than the mixture of rod-shaped particles and spherical particles.

As shown the result of the above Example and Comparison Example, the particles having special structure according to the present invention have better electrostatic discharge prevention effect at a low voltage and are more effective to keep the initial insulation state.

Although more detailed descriptions have been given by examples, those are only for explanation and there is no intention to limit the invention. The scope of the present invention should be interpreted by the following claims and it should be interpreted that all spirits equivalent to the following claims fall with the scope of the present invention.

What is claimed is:

1. Particles for preventing electrostatic discharge in which one or more rod-shaped particle is adhered to the surface of spherical particle.

2. The particles for preventing electrostatic discharge of claim 1, wherein a material of the rod-shaped particle and the spherical particle is selected from the group consisting of a metal, an oxide and a metal coated with an oxide film.

3. The particles for preventing electrostatic discharge of claim 2, wherein the metal is selected from the group consisting of manganese, zirconium, tantalum, molybdenum, nickel, aluminum, chromium and a combination thereof.

4. The particles for preventing electrostatic discharge of claim 2, wherein the oxide is selected from the group consisting of alumina, NiO, ZnO, $SiO_2$ and $TiO_2$.

5. The particles for preventing electrostatic discharge of claim 1, wherein a ratio of length of the rod-shaped particle: diameter of the spherical particle is 5:1 to 1:20.

6. Paste for preventing electrostatic discharge comprising the particles for preventing electrostatic discharge of claim 1.

* * * * *